(12) United States Patent
Obata

(10) Patent No.: US 6,312,269 B1
(45) Date of Patent: Nov. 6, 2001

(54) CARD CONNECTOR CIRCUIT BOARD

(75) Inventor: Hiroyuki Obata, Kanagawa (JP)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/469,828

(22) Filed: Dec. 22, 1999

(30) Foreign Application Priority Data

Dec. 25, 1998 (JP) ................................................. 10-368641

(51) Int. Cl.$^7$ ................................................. H01R 13/648
(52) U.S. Cl. ............................ 439/108; 174/262; 174/261
(58) Field of Search ................................. 439/637, 636, 439/108, 91, 541.5; 361/780, 794; 174/36, 261, 262

(56) References Cited

U.S. PATENT DOCUMENTS

| | | | |
|---|---|---|---|
| 3,399,372 | * | 8/1968 | Uberbacher ........................... 439/60 |
| 5,026,292 | * | 6/1991 | Pickles et al. ....................... 439/108 |
| 5,322,447 | * | 6/1994 | Okada ................................ 439/541.5 |
| 5,580,257 | * | 12/1996 | Harwath ................................ 439/607 |
| 5,711,679 | * | 1/1998 | Spickler et al. ..................... 439/541.5 |
| 5,775,923 | * | 7/1998 | Tomioka ............................ 439/541.5 |
| 5,813,883 | * | 9/1998 | Lin .................................... 439/637 |
| 6,062,904 | * | 5/2000 | Oguchi et al. ...................... 439/541.5 |

FOREIGN PATENT DOCUMENTS 922762    1/1997   (JP) .

OTHER PUBLICATIONS

Japanese Patent Application No. 9–22762.

* cited by examiner

*Primary Examiner*—Renee Luebke
*Assistant Examiner*—Briggitte Hammond

(57) ABSTRACT

The present invention provides a card connector circuit board, which is easy to manufacture and which can provide good electrical characteristics with respect to the signal and ground lines. The circuit board (10), which is mounted on a back surface of a mother board mounted type card connector (80) in which card-accommodating sections (81, 82) are disposed in two stages that are stacked in the direction of height, is formed as a two-sided circuit board which includes opposite surfaces (11, 12). Circuit board (10) has a first card-connection section (91), which is connected to the card-accommodating section (81), and a second card-connection section (92), which is connected to the card-accommodating section (82). Signal lines include first signal lines (61), which connect the first card-connection section (91) and the mother board connection section (30) on the one surface (11), and second signal lines (64), which connect the second card-connection section (92) and the mother board side connection section (30) on the side of the other surface (12). Furthermore, the ground lines include first ground lines (62), which connect the first card-connection section (91) and the mother board side connection section on the first surface (11), and a second ground line or ground surface (71), which is made wider than the first ground lines (61), and which connects the second card-connection section (92) and the first ground lines (62) on the first surface (11).

8 Claims, 2 Drawing Sheets

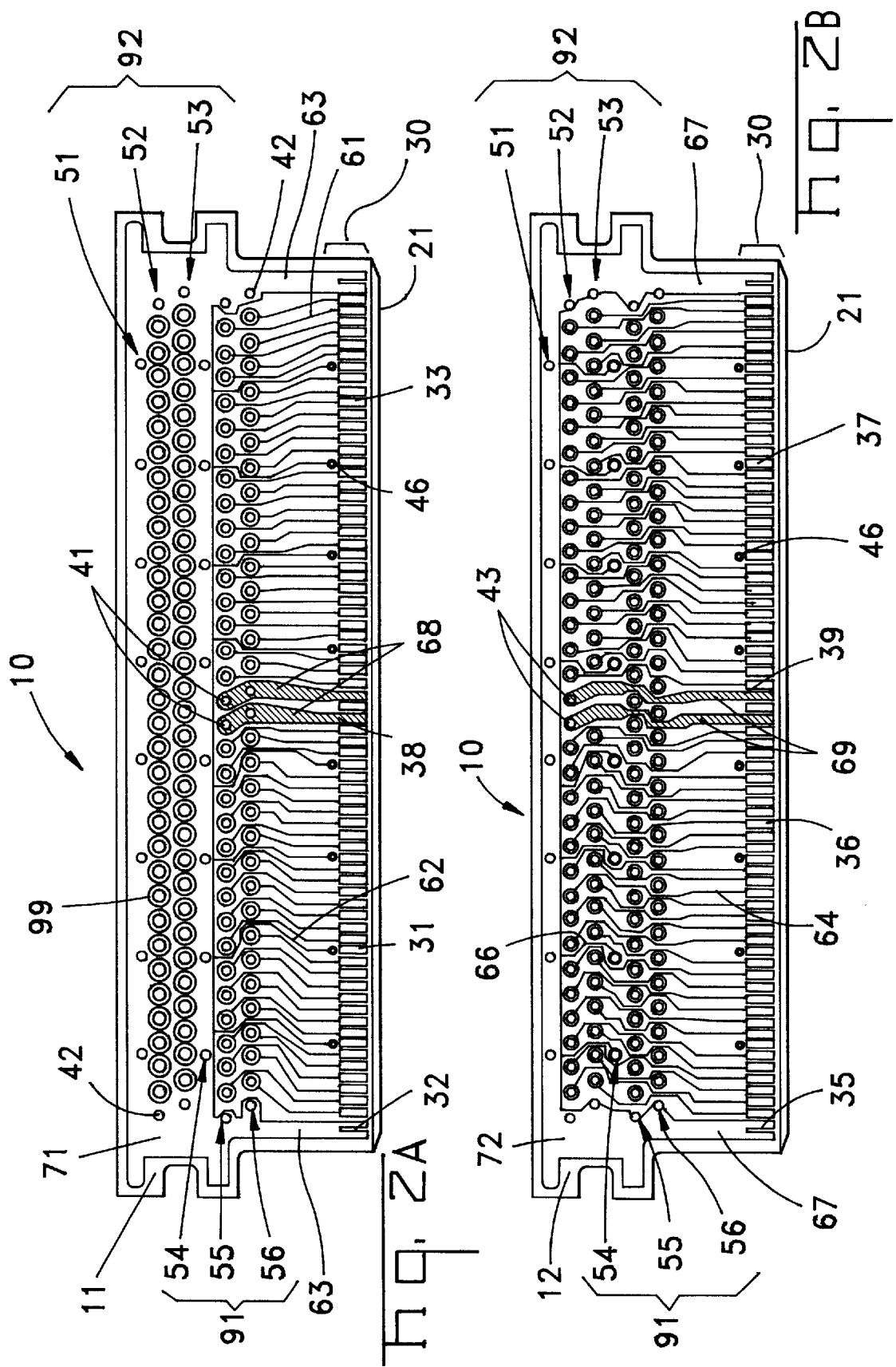

CARD CONNECTOR CIRCUIT BOARD

FIELD OF THE INVENTION

The present invention relates to a card connector circuit board which is mounted on a card connector that is mounted on a mother board and that is capable of accommodating cards, and which forms at least a portion of the circuit that is used to interconnect the cards and the mother board.

BACKGROUND OF THE INVENTION

An example of a card connector which uses a single circuit board for signal and ground connections between cards and a mother board is disclosed in Japanese Patent Application No. 9-22762. The card connector has card accommodating sections arranged in two stages, i.e., an upper stage card-accommodating section and a lower stage card-accommodating section. A circuit board is disposed along a back surface of the card connector, and it is used for mutual connections at a relatively high frequency. The circuit board contains four layers of circuit wiring; the inner two layers are used for signal lines, while the outer two layers are used for ground lines. However, a manufacturing process for making a four-layer circuit board is relatively complicated, and the manufacturing cost is also high. Accordingly, an important object of the present invention is to provide a card connector circuit board which is easy to manufacture, and which can provide good electrical characteristics with respect to the signal and ground lines.

SUMMARY OF THE INVENTION

The present invention is directed to a card connector circuit board which is mounted on the back surface of a card connector, and which has first and second card-connection sections that are respectively connected to a lower stage first card-accommodating section and an upper stage second card-accommodating section arranged in two stages in the card connector, a mother board connection section which is connected to a connecting section on the side of the mother board on which the card connector is mounted, and signal lines and ground lines that connect the first and second card-connection sections with the mother board connection section, a two-layer circuit structure is formed which has circuits only on two opposite surfaces of the circuit board, the signal lines include first signal lines which connect the first card-connection section and the mother board side connection section on one side of the circuit board, and second signal lines which connect the second card-connection section and the mother board side connection section on the other side of the circuit board, and the ground lines include first ground lines which connect the first card-connection section and the mother board side connection section on the first side of the circuit board, and a second ground line which is made wider than the first ground lines, and which connects the second card-side connection section and the first ground lines on the first side of the circuit board.

The ground lines further include third ground lines which connect the second card-connection section and the first ground lines on the second side of the circuit board.

The second ground line is formed as a ground surface which extends in a plane corresponding to the second card-connection section.

The ground surface is extended in the vicinity of both ends of the card connector circuit board so that the ground surface extends to the mother board connection section.

The ground surface is disposed so that the ground surface also overlaps with the ground connection sections of the first card-connection section.

BRIEF DESCRIPTION OF THE DRAWINGS

An embodiment of the present invention will now be described by way of example with reference to the accompanying drawings in which:

FIG. 1a is a side view, and FIG. 1b is a part enlarged side view.

FIGS. 2a and 2b show the construction of electrical circuits formed on the card connector circuit board shown in FIG. 1, FIG. 2a shows the circuit wiring on one side of the circuit board, while FIG. 2b shows the circuit wiring on the other side of the circuit board as seen from the same side as in FIG. 2a.

DETAILED DESCRIPTION OF THE INVENTION

Figure 1A:
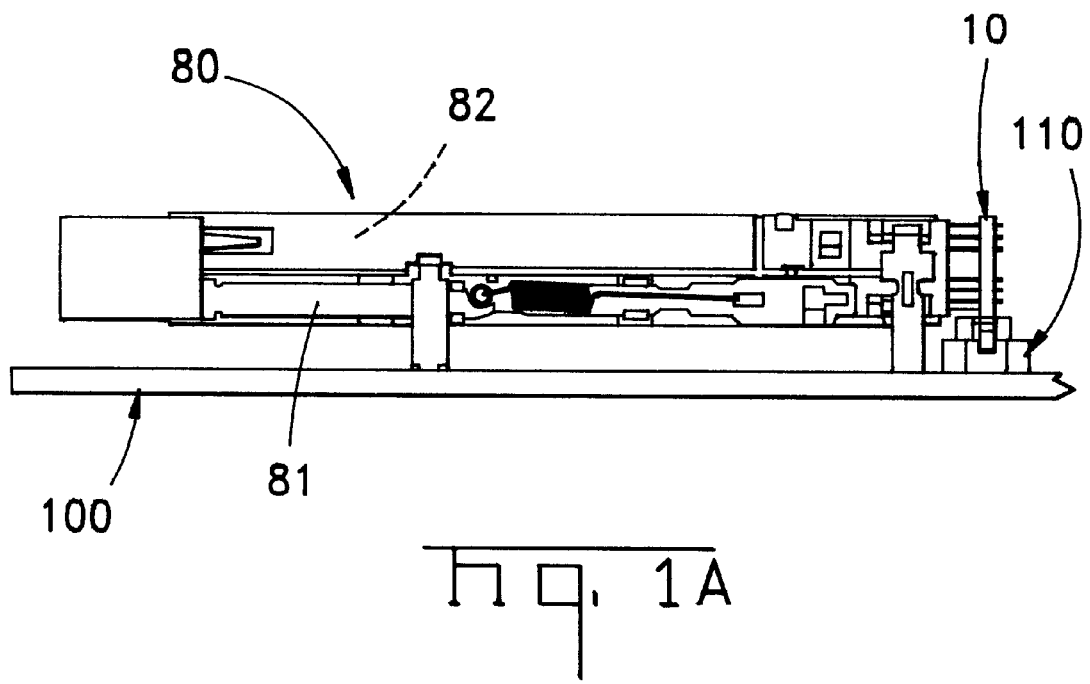
FIGS. 1a and 1b show the construction of a card connector in which the card connector circuit board of the present invention is used.
Figure 1B:
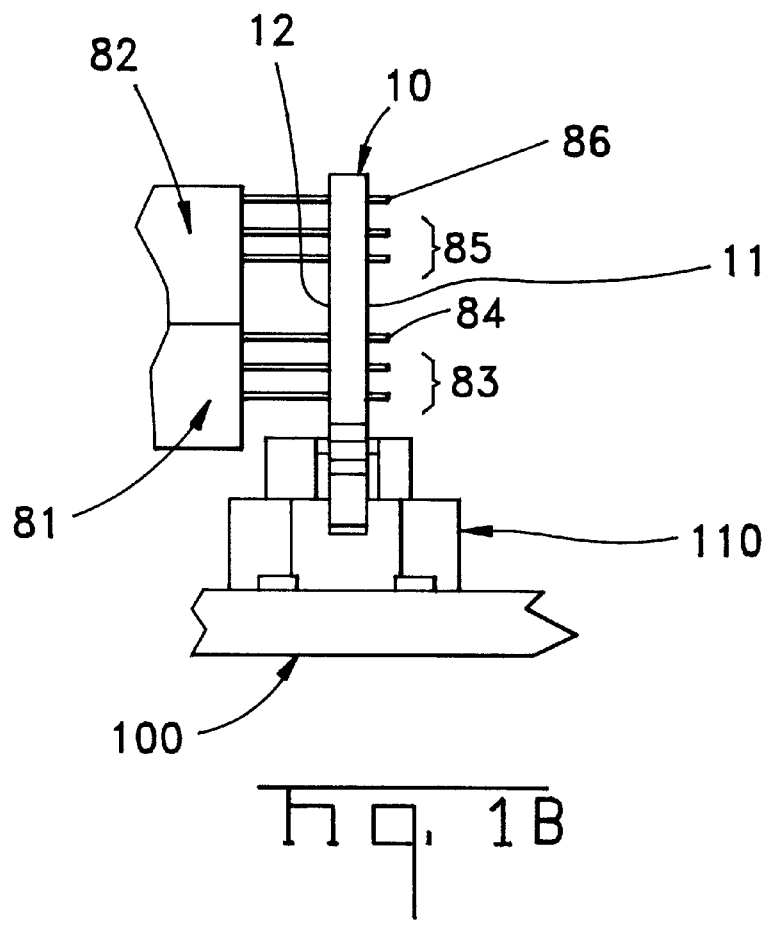

As shown in FIGS. 1a and 1b, card connector 80 is a card connector of the type that is mounted on a mother board 100. The card connector 80 is constructed so that it can accommodate cards (not shown) from a horizontal direction; card connector 80 has first and second card-accommodating sections 81, 82 arranged in two stages so that two cards stacked in the height direction can be accommodated. The card connector 80 is shown with the first card-accommodating section 81 positioned at a lower stage (i.e., on the side closer to the mother board), and the second card-accommodating section 82 is positioned in an upper stage (i.e., on the side further from the mother board). The card connector 80 has a set of first signal line rows 83 and a first ground line row 84, and a set of second signal line rows 85 and a second ground line row 86, which are positioned so that these sets of line rows respectively correspond to the first and second card-accommodating sections 81, 82. The line rows are parts of electrical contacts that are electrically connected to the cards accommodated in the first and second card-accommodating sections 81, 82.

The card connector 80 has a card connector circuit board 10, which extends in a vertical direction along an inner end of the card connector 80. Circuit board 10 is connected to the first signal and ground line rows 83, 84 and second signal and ground line rows 85, 86 by means of soldering. Furthermore, the bottom end of the circuit board 10 is accommodated in a board-mounting connector 110 mounted beforehand on the mother board 100, and it is electrically connected to the board-mounting connector 110. As a result, the cards (not shown) accommodated in the first and second card-accommodating sections 81, 82 are electrically connected to the mother board 100 via the circuit board 10 and board-mounting connector 110.

As shown in FIGS. 1 and 2, the circuit board 10 is a two-layer circuit board which has a pair of opposite circuit-wiring surfaces 11, 12, with different wiring being constructed in the respective layers. A mother board connection section 30 comprises a plurality of contact pads 31, 32, 33, 35, 36 and 37 formed on both surfaces 11, 12 at a bottom end 21 that is accommodated in the board-mounting connector 110. The plurality of contact pads 31, 32, 33, 35, 36 and 37 make electrical connections with electrical contacts (not shown) of the board-mounting connector 110.

A plurality of through-hole or via hole rows 51, 52, 53, 54, 55 and 56 are located in an upper end of circuit board 10, which are spaced from the plurality of contact pads 31, 32, 33, 35, 36 and 37. As will be seen by referring to FIG. 1b, the through-hole row 54 accommodates the first ground line row 84, and the second and third through-hole rows 55, 56 positioned below the first through-hole row 54 accommodate the first signal line rows 83. In other words, the first through third through-hole rows 54, 55 and 56 constitute a first card-connection section 91, which is connected to the first card-accommodating section 81. The fourth through-hole row 51 positioned at an uppermost end of circuit board 10 accommodates the second ground line row 86, and the fifth and sixth through-hole rows 52, 53 positioned below the fourth through-hole row 51 accommodate the second signal line rows 85. In other words, the fourth through sixth through-hole rows 51, 52 and 53 constitute a second card-connection section 92, which is connected to the second card-accommodating section 82.

As shown in FIG. 2a, first signal lines 61, which electrically connect the second and third through-hole rows 55, 56 that form a part of the signal circuit with the signal pads 33 used for signal connections with respect to the board-mounting connector 110 (see FIG. 1), are formed on one surface 11 of the circuit board. Furthermore, surface 11 has a ground surface (second ground line) 71 which connects the first through-hole row 54 and the fourth through-hole row 51 to each other. As shown in FIG. 2a, the ground surface 71 forms a surface which extends over about one-third of surface 11 while avoiding the fifth and sixth through-hole rows 52, 53 so that the through-hole rows are not electrically connected to each other. Specifically, the single ground surface 71 extends over the entire surface of the second card-side connection section 92 on the side of the surface 11, and it further extends so that the through-holes of the first through-hole row 54 are mutually connected. The ground surface 71 is connected to a plurality of corresponding ground pads 31 via the first ground lines 62. The ground surface 71 is also connected to additional ground pads 32 positioned at the outermost sides of circuit board 10 via ground extension lines 63 positioned along both ends thereof.

As shown in FIG. 2a, two pairs of through-holes 41 positioned roughly in the center of the second and third through-hole rows 55, 56 are used for the power supply, and they are connected to corresponding power supply pads 38 by means of wide lines 68. Through-holes 42 located at both ends of the second and third through-hole rows 55, 56 and at both ends of the fifth and sixth through-hole rows 52, 53 are electrically connected to the ground surface 71 or the additional ground lines 63.

As shown in FIG. 1b, the surface 11 is positioned facing outward so that it does not face the main body of the card connector 80. Consequently, surface 11 is used to make solder connections with the line rows 83, 84, 85 and 86. Accordingly, it should be noted in FIGS. 2a and 2b that soldering pads 99 used to make solder connections are formed in the vicinities of all of the through-holes.

Meanwhile, as shown in FIG. 2b, second signal lines 64, which electrically connect the fifth and sixth through-hole rows 52, 53 that form a part of the signal circuit with the signal pads 36 used for signal connections with respect to the board mounting connector 110 (see FIG. 1), are formed on the other surface 12 of the circuit board. Furthermore, surface 12 has third ground lines 66, which connect the fourth through-hole row 51 and the first through-hole row 54 to each other. On the side of the surface 12, the through-holes of the first through-hole row 54 are not mutually connected, and the second signal lines 64 extend between the third ground lines 66. However, the through-holes of the fourth through-hole row 54 are mutually connected by an auxiliary ground surface 72. As shown in FIG. 2b, the auxiliary ground surface 72 is also connected to the additional ground pads 35 positioned at the outermost sides by means of ground extension lines 67 that extend along both ends of the auxiliary ground surface 72.

As shown also in the FIG. 2b, two pairs of through-holes 43, which are positioned roughly in the center of the fifth and sixth through-hole rows 52, 53, are used for the power supply, and they are connected to corresponding power supply pads 39 by means of wide lines 69. Furthermore, ground pads 37, which are disposed so that they are inserted between the signal pads 36 at specified intervals, are electrically connected to the ground pads 31 and first ground lines 62 on the surface 11 via through-holes 46 positioned in the vicinity of the ground pads 37. Moreover, as shown in FIG. 2a, the through-holes 42 are also connected to the auxiliary ground surface 72.

In the circuit board 10, since a two-sided board which has only the surfaces 11, 12 for circuit wiring is used, favorable electrical characteristics can be provided for the card connector 80, which has card-accommodating sections 81, 82 positioned in a stacked arrangement. As was described above, the reason for this is that ground wiring suitable for the signal wiring is provided within a region of limited dimensions. In particular, the formation of a ground surface 71 corresponding to the second card-connection section 92 positioned at the upper end of the circuit board contributes greatly to the favorable electrical characteristics.

A card connector circuit board constituting a preferred embodiment of the present invention has been described above. However, this embodiment is merely an example, and it does not limit the present invention. Various alterations and modifications of the invention may be made by a person skilled in the art.

A card connector circuit board of the present invention is directed to a two-layer circuit structure, which has circuits only on two opposite surfaces of the circuit board, the signal lines include first signal lines which connect a first card-connection section and the mother board connection section on one side of the circuit board, and second signal lines, which connect a second card-connection section and the mother board connection section on the other side of the circuit board, and the ground lines include a first ground line, which connects the first card-connection section and the mother board connection section on the first side of the circuit board, and a second ground line, which is made wider than the first ground line and which connects the second card-connection section and the first ground line on the first side of the circuit board. Consequently, the card connector circuit board of the present invention is easy to manufacture and can be obtained at a low cost; furthermore, good electrical characteristics can be obtained with respect to the signal and ground lines, and the external dimensions of the circuit board can be made relatively small. Accordingly, the circuit board of the present invention is suitable for use in card connectors in which card-accommodating sections are disposed in a stacked arrangement.

What is claimed is:

1. A card connector circuit board for electrical connection to a circuit board on a mother board and for electrical connection to upper and lower card-accommodating sections of a card connector, the card connector circuit board comprising:

a first circuit wiring surface on one side and a second circuit-wiring surface on the other side of the card connector circuit board;

a mother board connection section at a lower end of the card connector circuit board for electrical connection to the circuit board connector;

a first card-connection section at an upper end of the card connector circuit board for electrical connection to upper signal and ground contacts of the upper card-accommodating section;

a second card-connection section positioned below the first card-connection section of the card connector circuit board for electrical connection to lower signal and ground contacts of the lower card-accommodating section;

first signal lines and ground lines connecting the first card-connection section on the one side of the card connector circuit board to the mother board connection section;

second signal lines and ground lines connecting the second card-connection on the other side of the card connector circuit board to the mother board connection section; and, power lines extending from midway of the card connector circuit board to the mother board connection section centrally of the mother board.

2. A card connector circuit board as claimed in claim 1, wherein additional ground lines are provided connecting the second card-connection section and the first ground lines thereon.

3. A card connector circuit board as claimed in claim 1, wherein the second ground lines are formed as a ground surface extending in a plane corresponding to the second card-connection section.

4. A card connector circuit board as claimed in claim 3, wherein the ground surface is extended at both ends of the card connector circuit board so that the ground surface extends to the mother board connection section.

5. A card connector circuit board as claimed in claim 4, wherein the ground surface overlaps with a ground connection section of the first card-connection section.

6. A card connector circuit board having circuit traces on opposite first and second circuit-wiring surfaces, the card connector circuit board comprising:

a first ground surface disposed on the first circuit-wiring surface;

a plurality of ground lines extending from the first ground surface along the first circuit-wiring surface between adjacent signal lines to ground pads positioned along an edge of the card connector circuit board;

a second ground surface disposed on the second circuit-wiring surface;

a plurality of ground lines extending from the second ground surface along the second circuit-wiring surface between adjacent signal lines to a plated through hole which is electrically connected through the card connector circuit board to the first ground surface.

7. The card connector circuit board of claim 6 wherein the first ground surface extends along an area of through holes for receiving a plurality of signal contacts and extends downward along opposite sides of the card connector circuit board to additional ground pads.

8. The card connector circuit board of claim 6 wherein the second ground surface extends along a row of through holes for receiving ground pins and extends downward along opposite sides of the card connector circuit board to third ground pads.

* * * * *